(12) United States Patent
Chuang et al.

(10) Patent No.: US 9,666,630 B2
(45) Date of Patent: May 30, 2017

(54) SEMICONDUCTOR DEVICES, METHODS OF MANUFACTURING THEREOF, AND IMAGE SENSOR DEVICES

(71) Applicant: Taiwan Semiconductor Manufacturing Company, Ltd., Hsin-Chu (TW)

(72) Inventors: Chun-Chieh Chuang, Tainan (TW); Dun-Nian Yaung, Taipei (TW); Jen-Cheng Liu, Hsin-Chu (TW); Tzu-Hsuan Hsu, Kaohsiung (TW); Feng-Chi Hung, Chu-Bei (TW); Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/066,658

(22) Filed: Mar. 10, 2016

(65) Prior Publication Data

US 2016/0197114 A1 Jul. 7, 2016

Related U.S. Application Data (63) Continuation of application No. 14/063,953, filed on Oct. 25, 2013, now Pat. No. 9,312,294.

(51) Int. Cl.
*H01L 27/146* (2006.01)

(52) U.S. Cl.
CPC .... *H01L 27/14636* (2013.01); *H01L 27/1463* (2013.01); *H01L 27/1464* (2013.01); *H01L 27/1469* (2013.01); *H01L 27/14603* (2013.01); *H01L 27/14632* (2013.01); *H01L 27/14634* (2013.01); *H01L 27/14687* (2013.01)

(58) Field of Classification Search
CPC ......... H01L 27/14636; H01L 27/14685; H01L 27/14687; H01L 27/14621; H01L 27/14627
See application file for complete search history.

(56) References Cited

U.S. PATENT DOCUMENTS

| | | | |
|---|---|---|---|
| 8,653,676 B2 | 2/2014 | Kim et al. | |
| 8,981,510 B2 | 3/2015 | Chuang et al. | |
| 2009/0206411 A1 | 8/2009 | Koketsu et al. | |
| 2009/0224347 A1 | 9/2009 | Kim et al. | |
| 2011/0163364 A1 | 7/2011 | Kim et al. | |
| 2012/0205769 A1 | 8/2012 | Tsai et al. | |
| 2013/0181317 A1* | 7/2013 | Wakiyama | H01L 21/76805 257/459 |
| 2013/0248862 A1 | 9/2013 | Inoue et al. | |
| 2014/0042581 A1* | 2/2014 | Mheen | H01L 31/02002 257/438 |
| 2014/0131828 A1 | 5/2014 | Isono et al. | |

FOREIGN PATENT DOCUMENTS

TW 201320259 A1 5/2013

* cited by examiner

*Primary Examiner* — Andy Huynh
(74) *Attorney, Agent, or Firm* — Slater Matsil, LLP (57) ABSTRACT

Semiconductor devices, methods of manufacturing thereof, and image sensor devices are disclosed. In some embodiments, a semiconductor device comprises a semiconductor chip comprising an array region, a periphery region, and a through-via disposed therein. The semiconductor device comprises a guard structure disposed in the semiconductor chip between the array region and the through-via or between the through-via and a portion of the periphery region.

20 Claims, 6 Drawing Sheets

SEMICONDUCTOR DEVICES, METHODS OF MANUFACTURING THEREOF, AND IMAGE SENSOR DEVICES

This application is a continuation of U.S. patent application Ser. No. 14/063,953, entitled "Semiconductor Devices, Methods of Manufacturing Thereof, and Image Sensor Devices," filed on Oct. 25, 2013, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, in other types of packaging, or used directly in an end application, for example.

Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic memory, processors, and/or other functions.

Complementary metal oxide semiconductor (CMOS) image sensor (CIS) devices are semiconductor devices that are used in some cameras, cell phones, and other devices for capturing images. Back side illumination (BSI) image sensors are CIS devices in which light enters from a back side of a substrate, rather than the front side. BSI sensors are capable of capturing more of an image signal than front side illumination image sensors due to reduced reflection of light, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor devices, manufacturing processes thereof, and image sensor devices. Novel guard structures and methods of formation thereof for semiconductor devices and image sensor devices will be described herein.

Figure 1:
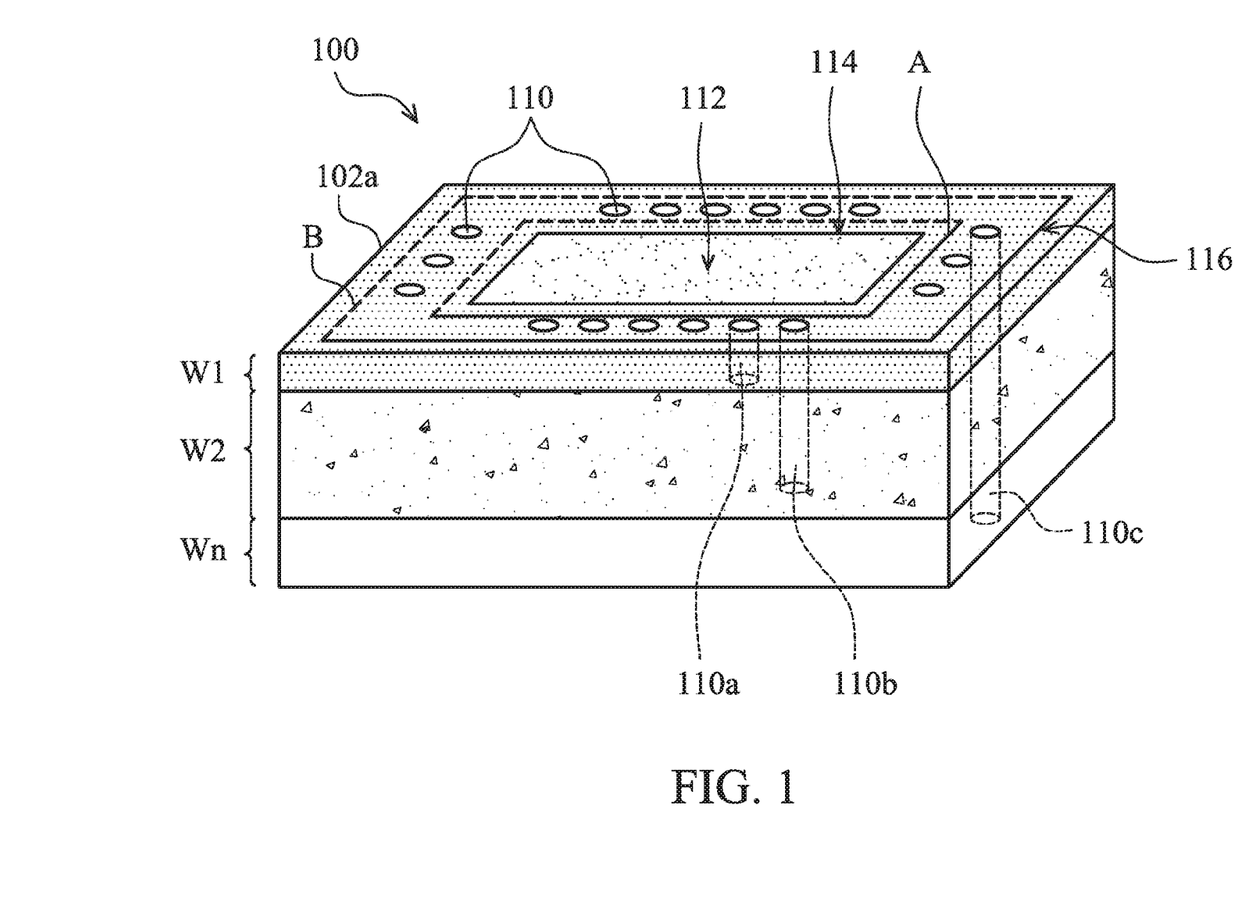
FIG. 1 is a perspective view illustrating a semiconductor device in accordance with some embodiments of the present disclosure.
Figure 2:
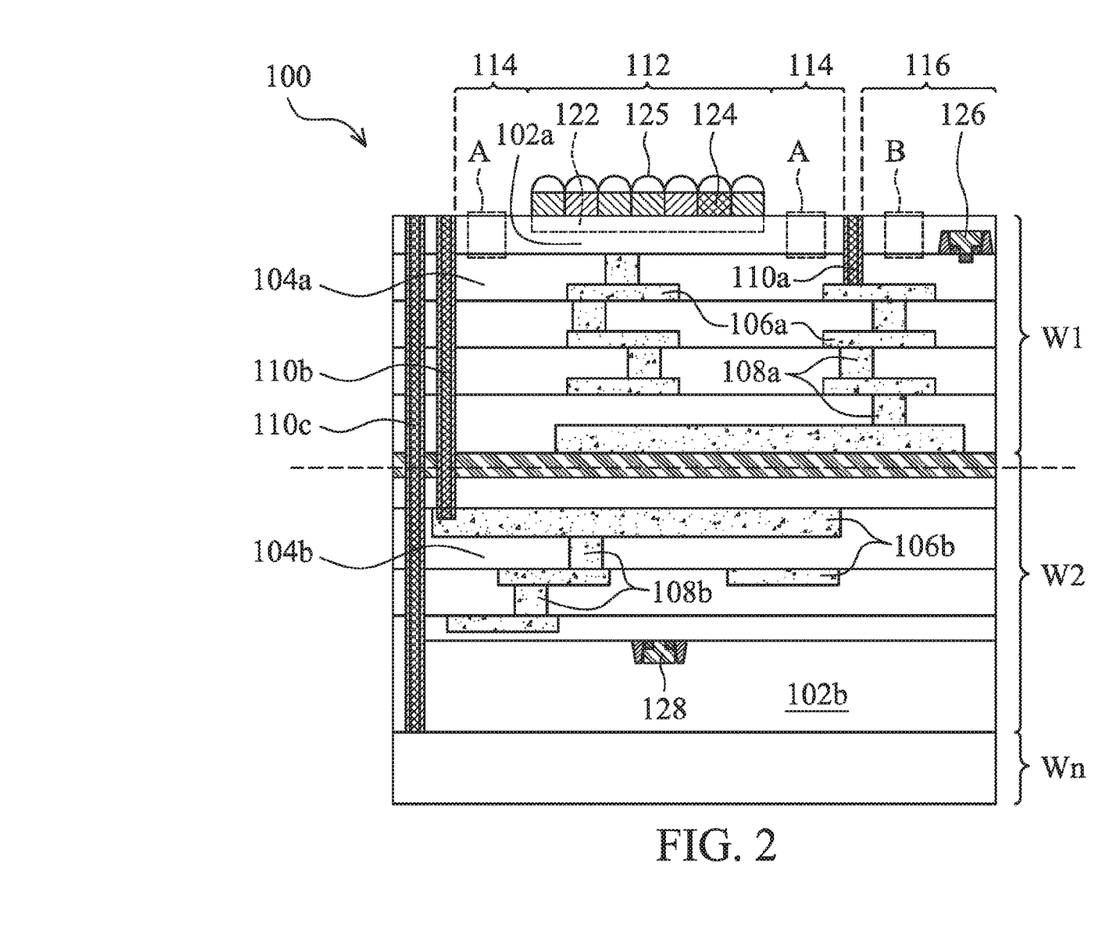
FIG. 2 is a cross-sectional view of a portion of the semiconductor device shown in FIG. 1 in accordance with some embodiments.

FIG. 1 is a perspective view illustrating a semiconductor device 100 in accordance with some embodiments of the present disclosure. FIG. 2 is a cross-sectional view of a portion of the semiconductor device 100 shown in FIG. 1 in accordance with some embodiments. The semiconductor device 100 includes three semiconductor chips W1, W2 and Wn bonded together. Semiconductor chip W1 comprises a first semiconductor chip that is bonded to a second semiconductor chip W2. A third semiconductor chip Wn is bonded to the second semiconductor chip W2. Only three semiconductor chips W1, W2 and Wn are shown in the drawings of the present disclosure; alternatively, the semiconductor device 100 may comprise a single semiconductor chip W1, two semiconductor chips W1, W2, or Wn, or four or more semiconductor chips, not shown.

The semiconductor chips W1, W2 and Wn may be bonded together using a suitable wafer bonding technique. Some examples of commonly used bonding techniques for wafer bonding include direct bonding, chemically activated bonding, plasma activated bonding, anodic bonding, eutectic bonding, glass frit bonding, adhesive bonding, thermocompressive bonding, reactive bonding and/or the like. After the semiconductor chips or wafers W1, W2, and Wn are bonded together, the interface between each pair of adjacent semiconductor wafers W1, W2 and Wn may provide an electrically conductive path between the stacked semiconductor wafers W1, W2, and Wn. In accordance with some embodiments, in a direct bonding process, the connection between the adjacent semiconductor wafers W1, W2, and Wn can be implemented using metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof, and/or the like. In some embodiments, at least two of the adjacent semiconductor wafers W1, W2, and Wn are bonded together using a suitable metal-dielectric bonding technique such as a copper-silicon oxide nitride (Cu—SiON) bonding process, as another example.

One or more through-vias 110, 110a, 110b, and 110c may be formed within the semiconductor device 100 that provide vertical electrical connections for the semiconductor device 100. The semiconductor device 100 includes a plurality of through-vias 110, 110a, 110b, and 110c in accordance with some embodiments. Reference number 110 labels the through-vias generally, and reference numbers 110a, 110b, and 110c label the through-vias according to the depths that they extend within the semiconductor device 100. Through-vias 110a extend at least partially through the first semiconductor chip W1 and provide vertical electrical connections for the first semiconductor chip W1, e.g., from an upper layer to an underlying lower layer, or between the various material layers of the first semiconductor chip W1. Through-vias 110b extend through the first semiconductor chip W1 and at least partially through the second semiconductor chip W2, providing vertical electrical connections between the first semiconductor chip W1 and the second semiconductor chip W2. Through-vias 110c extend through the first semiconductor chip W1 and the second semiconductor chip Wn, and at least partially through the third semiconductor chip Wn, providing vertical electrical connections between the first semiconductor chip W1 and the third semiconductor chip Wn. Only three through-vias 110a, 110b, and 110c are shown extending through the first, second, and/or third semiconductor chips W1, W2 and Wn; however, alternatively, a plurality of the through-vias 110a, 110b, and 110c may extend through the first, second, and/or third semiconductor chips W1, W2 and Wn, as shown at 110 in FIG. 1, for example.

The first semiconductor chip W1 includes an array region 112, a periphery region 116, and at least one through-via 110, 110a, 110b, and 110c disposed therein. The first semiconductor chip W1 includes an intermediate region 114 disposed between the through-vias 110, 110a, 110b, and 110c and the array region 112, in accordance with some embodiments of the present disclosure.

The array region 112 includes a plurality of devices formed therein. In some embodiments, the plurality of devices in the array region 112 comprises a plurality of pixels, shown in FIG. 2, e.g., wherein the semiconductor device 100 comprises an image sensor device. The first semiconductor chip W1 comprises a pixel array wafer in some embodiments, for example. The array region 112 of the first semiconductor chip W1 comprises an array of pixels 122 in accordance with some embodiments, for example. In some embodiments, the first semiconductor chip W1 comprises a complementary metal oxide semiconductor (CMOS) image sensor (CIS) wafer or device, for example. The semiconductor device 100 comprises a stacked CMOS image sensor device in some embodiments, as another example.

FIG. 2 illustrates portions of the various regions of the first semiconductor chip W1 and the second semiconductor chip W2 in more detail. The first semiconductor chip W1 includes a substrate 102a and an inter-metal dielectric (IMD) 104a disposed over the substrate 102a. The substrate 102a may include a semiconductor substrate comprising silicon or other semiconductor materials and may be covered by an insulating layer, for example. The substrate 102a may also include other active components or circuits, not shown. The substrate 102a may comprise silicon oxide over single-crystal silicon, for example. Compound semiconductors, GaAs, InP, Si/Ge, or SiC, as examples, may be used in place of silicon. The substrate 102a may comprise a silicon-on-insulator (SOI) or a germanium-on-insulator (GOI) substrate, as examples. In embodiments wherein the first semiconductor chip W1 comprises a CIS wafer, the substrate 102a may include a variety of electrical circuits and/or devices. The electrical circuits formed on the substrate 102a may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. For example, in accordance with some embodiments, the first semiconductor chip W1 includes at least one periphery device 126 (see FIG. 2) in the periphery region 116. Only one periphery device 126 is shown in FIG. 2; alternatively, a plurality of periphery devices 126 may be formed in the periphery region 116 (see FIG. 7). The periphery device 126 comprises a transistor in the embodiment shown; alternatively, the periphery devices 126 may comprise other types of circuit elements.

The IMD 104a comprises a plurality of insulating material layers that include a plurality of conductive lines 106a and conductive vias 108a formed therein. The IMD 104a, conductive lines 106a, and conductive vias 108a provide electrical connections for the first semiconductor chip W1 in a horizontal and vertical direction. The insulating material layers of the IMD 104a may comprise silicon dioxide, silicon nitride, low dielectric constant (k) insulating materials having a dielectric constant or k value less than silicon dioxide (e.g., a k value of about 3.9 or less), extra-low k (ELK) dielectric materials having a k value of about 3.0 or less, or other types of materials, as examples. The conductive lines 106a and vias 108b may comprise materials such as Cu, Al, alloys thereof, seed layers, and/or barrier layers formed using damascene and/or subtractive etch processes, as examples. Alternatively, the IMD 104a, conductive lines 106a, and conductive vias 108b may comprise other materials and may be formed using other methods.

In some embodiments, the periphery region 116 is disposed around the array region 112, as shown in FIG. 1. For example, the array region 112 of the first semiconductor chip W1 may be located in a substantially central region of the first semiconductor chip W1, and the periphery region 116 may be disposed around a perimeter of the first semiconductor chip W1, around the array region 112. The through-vias 110, 110a, 110b, and 110c are disposed between the array region 112 and the periphery region 116. Alternatively, the arrangement of the array region 112, periphery region 116, and through vias 110, 110a, 110b, and 110c may comprise other shapes and configurations. As another example, the array region 112 may be located in one corner of the first semiconductor chip W1, and the periphery region 116 may be located in an L-shaped region proximate the array region 112.

In embodiments wherein the array region 112 includes an array of pixels, the pixel array 122 is formed within the substrate 102a, as shown in FIG. 2. In some embodiments, a color filter material 124 is formed over the array of pixels 122, and a lens material 125 is formed over the color filter material 124. The pixels in the pixel array 122 are adapted to sense images received by the pixel array 122. The color filter material 124 is adapted to separate light to a red-green-blue (R, G, or B) original element when the semiconductor device 100 is utilized as a back side illumination image sensor, for example. The color filter material 124 comprises a photosensitive material in some embodiments, as another example. The lens material 125 may comprise a micro-lens material in some embodiments, as an example. Alternatively, the color filter material 124 and the lens material 125 may comprise other materials. In some embodiments, the color filter material 124 and/or the lens material 125 are not included, and the array region 112 may include other types of devices than pixels.

The second semiconductor chip W2 includes a substrate 102b that includes a plurality of devices 128 formed therein. The substrate 102b may include similar materials and devices as described for the substrate 102a of the first semiconductor chip W1, for example. The second semiconductor chip W2 includes an IMD 104b, a plurality of conductive lines 106b, and a plurality of conductive vias 108b disposed over the substrate 102b, that comprise similar materials as described for the first semiconductor chip W1. The first semiconductor chip W1 is inverted before bonding the first semiconductor chip W1 to the second semiconductor chip W2, as illustrated in FIG. 2, in some embodiments.

The third semiconductor chip Wn comprises similar materials as described for the first and second semiconductor chips W1 and W2, such as a substrate, various circuits and/or devices formed thereon, and an IMD, conductive lines, and vias, not shown, in some embodiments.

In accordance with some embodiments of the present disclosure, a guard structure (not shown in FIGS. 1 and 2; see guard structures 130 shown in FIGS. 3 and 4) is disposed in the first semiconductor chip W1 between the array region 112 and one of the through-vias 110, 110a, 110b, and/or 110c (e.g., in the intermediate region 114), or between one of the through-vias 110, 110a, 110b, and/or 110c and a portion of the periphery region 116. In some embodiments, a guard structure 130 is included in the first semiconductor chip W1 between both the array region 112 and one of the through-vias 110, 110a, 110b, and/or 110c and also between one of the through-vias 110, 110a, 110b, and/or 110c and a portion of the periphery region 116. In some embodiments, a guard structure 130 is disposed in the first semiconductor chip W1 between the array region 112 and one of the through-vias 110, 110a, 110b, and/or 110c (e.g., in the intermediate region 114), and/or between one of the through-vias 110, 110a, 110b, and/or 110c and a periphery device 126 in the periphery region 116.

For example, in FIGS. 1 and 2, regions A illustrate regions where a guard structure 130 is formed in the first semiconductor chip W1 between the array region 112 and one of the through-vias 110a, 110b, and/or 110c in the intermediate region 114. Region B illustrates a region where a guard structure 130 is formed in the first semiconductor chip W1 between one of the through-vias 110a, 110b, and/or 110c and a portion of the periphery region 116 or a periphery device 126 in the periphery region 116.

Figure 3:
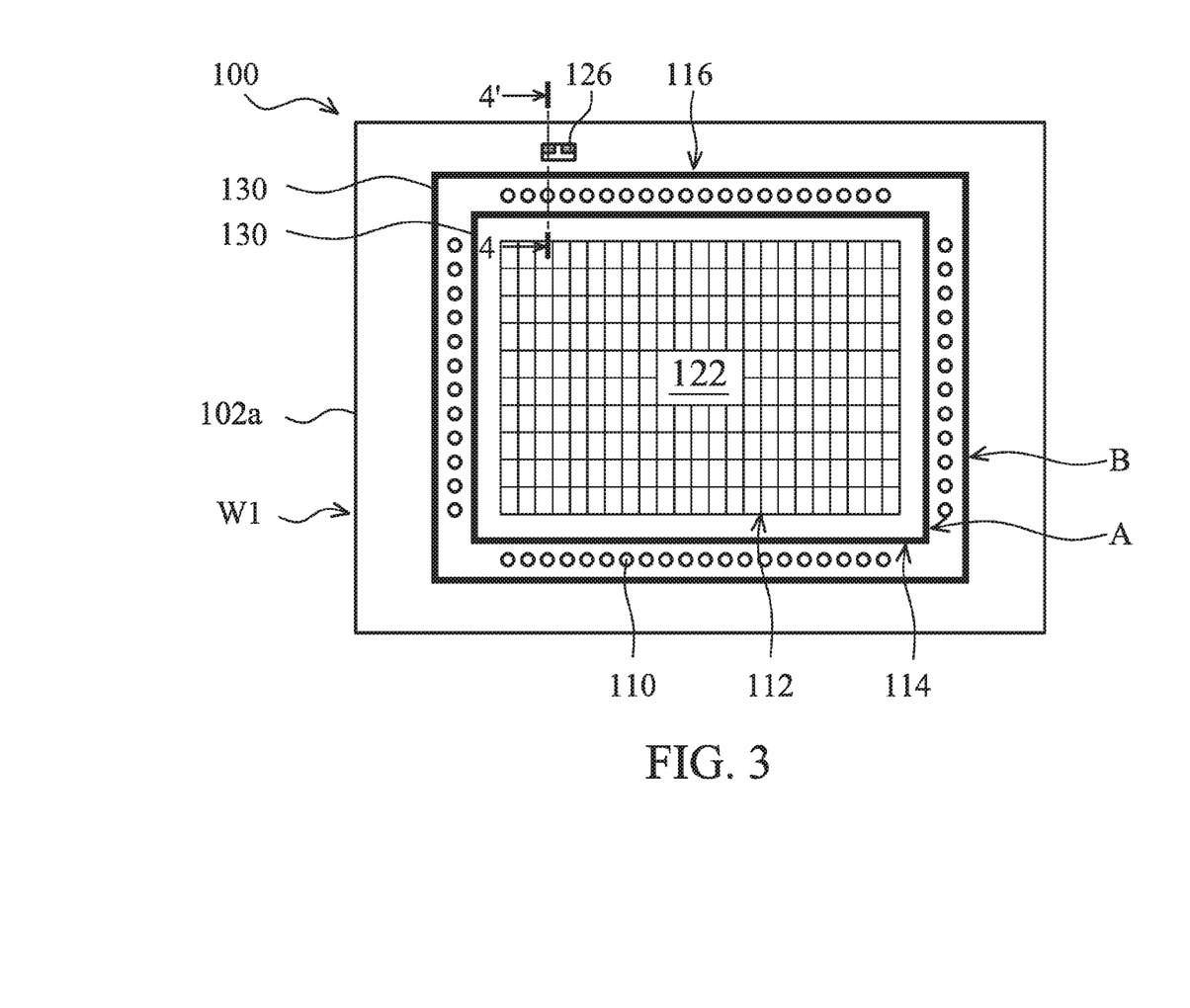
FIG. 3 is a top view that illustrates a guard structure disposed within a semiconductor device in accordance with some embodiments.

FIG. 3 is a top view of a semiconductor device 100 which illustrates a guard structure 130 disposed within the semiconductor device 100 in accordance with some embodiments. In some embodiments, the guard structure 130 comprises two or more portions (e.g., two portions are shown in FIG. 3), which portions are also referred to herein as guard structures 130. The guard structures 130 substantially comprise a shape in the top view of the first semiconductor chip W1 of the semiconductor device 100 of a rectangle in the embodiments shown. The guard structures 130 may also substantially comprise a shape in the top view of a square, e.g., in embodiments wherein the semiconductor device 100 is substantially square or other shapes. The guard structures 130 comprise rings of continuous material (or non-continuous in other embodiments, to be described further herein with reference to FIG. 5) around predetermined regions of the semiconductor device 100, in some embodiments. The two portions of the guard structure 130 shown in FIG. 3 include a first guard structure 130 disposed around the array region 112 including the pixel array 122 between the array region 112 and the through-vias 110; and a second guard structure 130 disposed around the through-vias 110 and the array region 112 between the through vias 110 and the periphery device 126 in the periphery region 116. Alternatively, the guard structure 130 may comprise one portion, or three or more portions.

Figure 4:
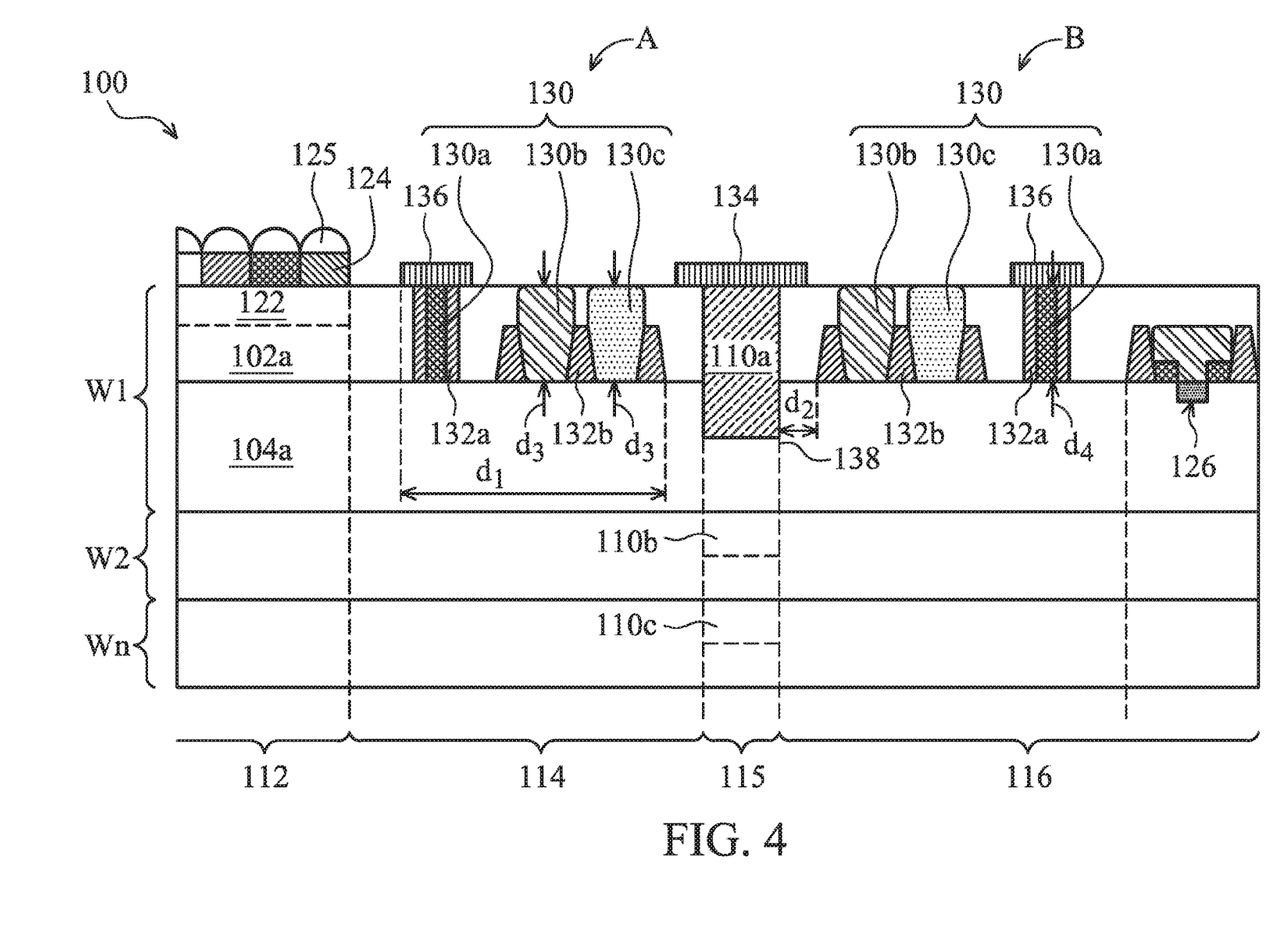
FIG. 4 is a cross-sectional view of a portion of the semiconductor device shown in FIG. 3 in accordance with some embodiments.

FIG. 4 is a cross-sectional view of a portion of the semiconductor device 100 shown in FIG. 3, at view 4-4' of FIG. 3 in accordance with some embodiments. More detailed views of the guard structure 130 in region A and the guard structure 130 in region B in accordance with some embodiments are illustrated in FIG. 4. The guard structures 130 may each comprise a metal feature 130a, a P-type region 130b, an N-type region 130c, or a combination thereof, in some embodiments. In some embodiments, the guard structures 130 may comprise only a metal feature 130a, only an N-type region 130c, only a P-type region 130b, or a combination of two or more thereof, for example. The guard structures 130 may comprise a plurality of the metal features 130a, a plurality of the P-type regions 130b, a plurality of the N-type regions 130c, or a combination thereof, in other embodiments.

In embodiments wherein the guard structure or structures 130 include a metal feature 130a, the guard structure 130 may comprise a trench formed within the substrate 102a of the first semiconductor chip W1. The metal feature 130a comprises a conductive material disposed within the trench. The conductive material of the metal feature 130a may comprise W, Cu, AlCu, other conductive materials, and/or combinations thereof, as examples.

The trench of the guard structure 130 comprising the metal feature 130a may be formed in some embodiments using a lithography process, by forming a layer of photoresist (not shown) over the substrate 102a, patterning the layer of photoresist by exposing the layer of photoresist to energy reflected from or transmitted through a lithography mask (also not shown) having a desired pattern thereon, developing the layer of photoresist, and removing exposed or unexposed portions of the layer of photoresist (depending on whether the photoresist comprises a positive or negative photoresist) using an ashing and/or etch process. The layer of photoresist is then used as an etch mask while portions of the substrate 102a are etched away using an etch process. The patterning process for the substrate 102a of the first semiconductor chip W1 may be performed before or after the first semiconductor chip W1 is bonded to another semiconductor chip, for example. Alternatively, the trenches for the metal features 110a may be formed using a direct patterning, laser drilling, or other type of process.

After the trenches are formed in the substrate 102a, the trenches are filled with a material. Filling the trenches with the material comprises filling the trenches with an insulating material, a conductive material, or a combination thereof in some embodiments. For example, in FIG. 4, the trenches are first lined with an insulating material 132a before forming the conductive material of the conductive features 110a. The insulating material 132a comprises about 1 nm to about 20 μm of silicon dioxide, silicon nitride (SiN), silicon oxynitride (SiON), a carbon-containing layer such as SiC, tantalum pentoxide ($Ta_2O_5$), aluminum oxide ($Al_2O_3$), hafnium oxide ($HfO_2$), other insulating materials, or combinations or multiple layers thereof in some embodiments. In other embodiments, an insulating material 132a is not formed in the trenches. The conductive material of the metal feature 130a is then formed within the trenches over the insulating material 132a, or directly into the trenches if the insulating material 132a is not included. The conductive material may be formed using a sputtering process, electrochemical plating (ECP), physical vapor deposition (PVD), or other methods, for example. Excess conductive material may be removed from over a top surface of the substrate 102a using a chemical-mechanical polishing (CMP) process, an etch process, or a combination thereof, for example. A barrier 136 may be disposed over a top surface of the metal features 130a, also shown in FIG. 4. The barrier 136 comprises a material such as an insulator that is adapted to prevent out-diffusion of a conductive material of the metal feature 130a, preventing contamination in some embodiments, for example. In other embodiments, the barrier 136 is not included.

In FIG. 4, a through-via 110a formed within the first semiconductor chip W1 is shown. A through-via 110b formed within the first semiconductor chip W1 and that also extends into the second semiconductor chip W2 is shown in phantom (e.g., in dashed lines). A through-via 110b formed within the first semiconductor chip W1 and that extends through the second semiconductor chip W2 and into the third semiconductor chip Wn is also shown in phantom.

The through-vias 110a, 110b, and 110c may be formed in the semiconductor device 100 after the bonding process for the semiconductor chips W1, W2, and Wn, in some embodiments. Trenches for the through-vias 110a, 110b, and 110c can be formed after the bonding process and then filled with a conductive material, such as W, Cu, AlCu, other conductive materials, and/or combinations or multiple layers thereof, as examples. The trenches are lined with about 0.5 μm to about 20 μm of an insulating material 138 such as silicon dioxide, SiN, SiON, a carbon-containing layer such as SiC, $Ta_2O_5$, $Al_2O_3$, $HfO_2$, other insulators, or combinations or multiple layers thereof in some embodiments, before forming the conductive material of the through-vias 110a, 110b, and 110c.

In other embodiments, portions of the through-vias 110a, 110b, and 110c may be formed before the bonding process during the manufacturing process of each of the semiconductor chips W1, W2, and Wn. The portions of the through-vias 110a, 110b, and 110c are positioned so that they align after the bonding process for the semiconductor chips W1, W2, and Wn in these embodiments, for example.

In embodiments wherein the guard structure or structures 130 include an N-type region 130c or a P-type region 130b, the guard structure or structures 130 may be formed by implanting the substrate 102a of the first semiconductor chip W1 and/or epitaxially growing a material with a trench formed in the substrate 102a to form a P-type material, an N-type material, or a combination thereof, for example, in accordance with some embodiments. The substrate 102a of the first semiconductor chip W1 may be implanted with a dopant such as B, As, or P; or SiGe or SiC implanted with B, As, or P, may be epitaxially grown in the trenches formed in the substrate 102a to form the guard structures 130 comprising the N-type regions 130c or the P-type regions 130b, as examples. Alternatively, the N-type regions 130c and the P-type regions 130b may be formed using other methods.

An insulating material 132b may be included in the first semiconductor chip W1 proximate the N-type regions 130c or the P-type regions 130b, also shown in FIG. 4. The insulating material 132b may comprise shallow trench isolation (STI) regions, in some embodiments. A contact (not shown) may also be disposed over a top surface of the N-type regions 130c or the P-type regions 130b, as illustrated for the guard structures 130 comprising the metal features 130a. In some embodiments, at least portions of the N-type regions 130c or the P-type regions 130b may be formed during the manufacturing process of other devices of the first semiconductor chip W1, such as the periphery devices 126, for example. Alternatively, additional processing steps can be included to form the N-type regions 130c or the P-type regions 130b.

In some embodiments, the guard structure or structures 130 comprise a width comprising dimension $d_1$ in the cross-sectional view shown in FIG. 4, wherein dimension $d_1$ comprises about 0.01 μm or greater, in some embodiments. The guard structure or structures 130 are spaced apart from the through-via 110a, 110b, or 110c by a dimension $d_2$ that comprises about 0.1 μm or greater, in some embodiments. The guard structure or structures 130 are formed at a depth of dimension $d_3$ or $d_4$ that comprises about 0.01 μm to about 100 μm below a surface of the first semiconductor chip W1, in some embodiments. In embodiments wherein the guard structures 130 comprise an N-type region 130c or a P-type region 130b, dimension $d_3$ comprises about 0.01 μm to about 20 μm below a surface of the first semiconductor chip W1, as another example.

In some embodiments, a voltage may be applied during the operation of the semiconductor device 100 to the guard structure or structures 130. For example, in embodiments wherein the guard structure 130 comprises a metal feature 130a, a voltage of about −10 Volts (V) to about 10 V may be applied to the metal feature 130a during the operation of the semiconductor device 100. In embodiments wherein the guard structure 130 comprises a P-type region 130b, a voltage of about 0 V to about −10 V may be applied to the P-type region 130b during the operation of the semiconductor device 100. In embodiments wherein the guard structure 130 comprises an N-type region 130c, a voltage of about 0.1 V to about 10 V may be applied to the N-type region 130c during the operation of the semiconductor device 100. Alternatively, other voltage levels may be applied to the ground structures 130 during the operation of the semiconductor devices 100 described herein. Applying the voltage to the guard structure 130 improves noise reduction of the guard structures 130 in some embodiments, for example. In other embodiments, a voltage may not be applied.

Two guard structures 130 are shown in FIGS. 3 and 4; alternatively, one, two, or three or more guard structures 130 may be included in a semiconductor device 100 in accordance with some embodiments.

Figure 5:
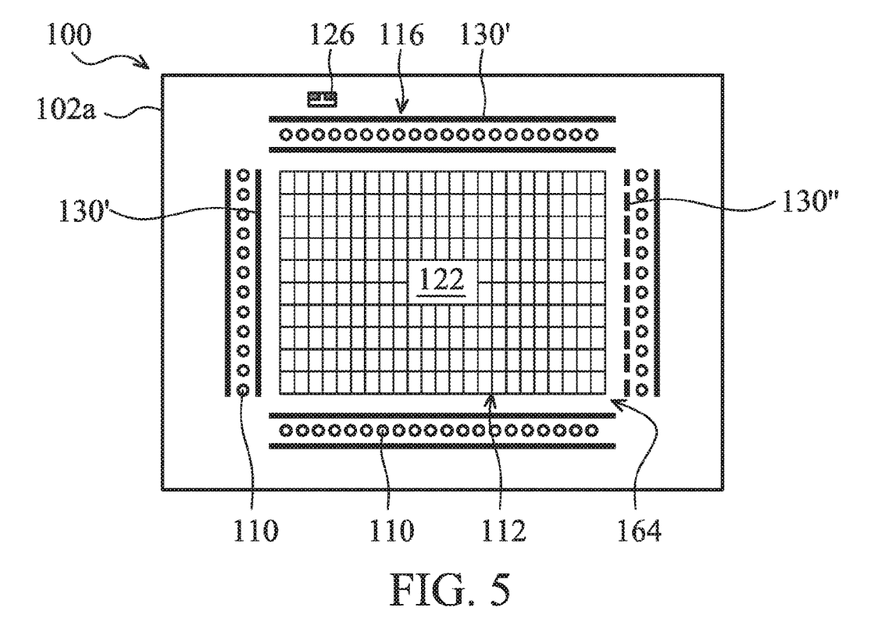
FIGS. 5 through 7 are top views of semiconductor devices that illustrate various shapes and configurations of guard structures for semiconductor devices in accordance with some embodiments.
Figure 6:
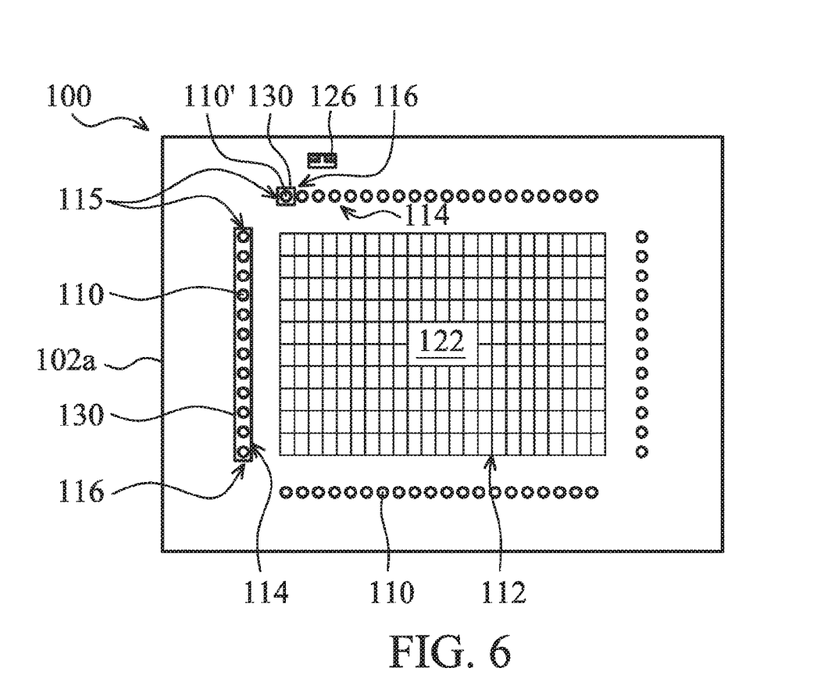
Figure 7:
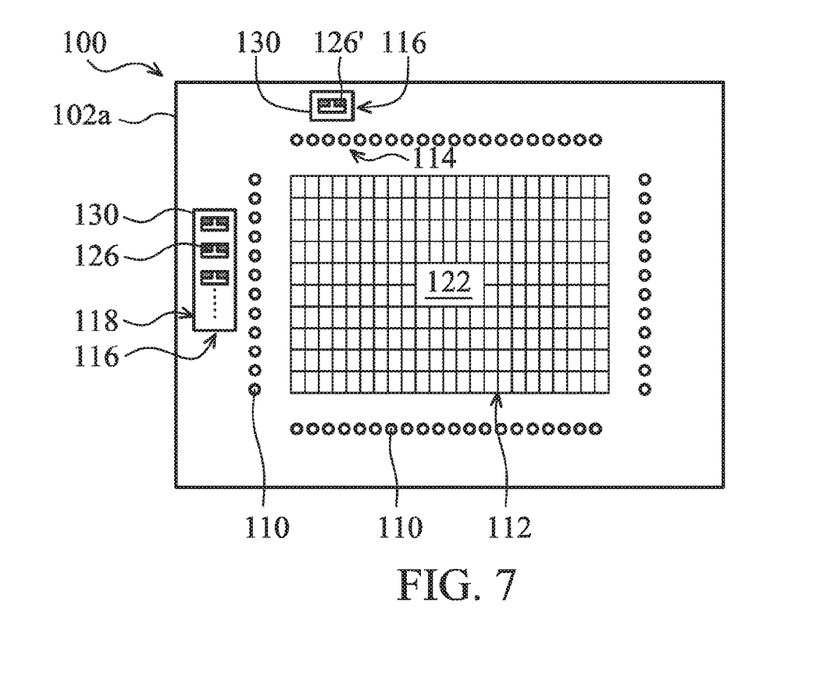

FIGS. 5 through 7 are top views of semiconductor devices 100 that illustrate various shapes and configurations of guard structures 130, 130' and 130" for semiconductor devices 100 in accordance with some embodiments. In accordance with some embodiments, the guard structures 130 may substantially comprise a shape in a top view of the first semiconductor chip W1 of a square or a rectangle (i.e., the embodiments shown in FIG. 3 and previously described herein, and in the embodiments shown in FIGS. 6 and 7). In other embodiments, the guard structures 130' and 130" may substantially comprise a shape in a top view of the first semiconductor chip W1 of a continuous bar, a plurality of continuous bars, a non-continuous bar, or a plurality of non-continuous bars (i.e., the embodiments shown in FIG. 5). In yet other embodiments, the guard structures 130, 130', and 130" may comprise combinations of the various shapes described herein.

In some embodiments, the guard structures 130 may be disposed proximate or around the array region 112 (i.e., the embodiments shown in FIGS. 3 and 5), disposed proximate or around the plurality of through-vias 110 (i.e., the embodiments shown in FIGS. 3, 5, 6, and 7), disposed proximate or around the plurality of through-vias 110 and the array region (i.e., the embodiments shown in FIGS. 3 and 5), disposed proximate or around one of the plurality of through-vias 110 (i.e., the embodiments shown in FIG. 6), disposed proximate or around a group of the plurality of through-vias 110 (i.e., the embodiments shown in FIG. 6), disposed proximate or around one of the plurality of periphery devices 126 (i.e., the embodiments shown in FIG. 7), disposed proximate or around a group of the plurality of periphery devices 126 (i.e., the embodiments shown in FIG. 7), or a combination thereof.

In FIG. 5, guard structures 130' substantially comprising a shape of a continuous bar are disposed proximate the through-vias 110. For example, the guard structures 130' extend along a row of the through-vias 110 along each side of the semiconductor device 100. The semiconductor device 100 includes guard structures 130' comprising a plurality of continuous bars, for example. The guard structures 130' are disposed either between the through-vias 110 and the array region 112, or between the through-vias 110 and the periphery region 116, or both. All or some of the guard structures of a semiconductor device 100 may comprise a guard structure 130' substantially having a shape of a continuous bar, in accordance with some embodiments.

Guard structure 130" substantially comprising a shape of a plurality of non-continuous bars are disposed proximate a group of the plurality of through-vias 110. For example, the guard structures 130" extends along a row of the through-vias 110 along each one side of the semiconductor device 100, and the guard structures 130" are disposed between the through-vias 110 and the array region 112 in the embodiment shown in FIG. 5. In other embodiments, the guard structures 130" may be disposed either between the through-vias 110 and the array region 112, between the through-vias 110 and the periphery region 116, or both (not shown). All or some of the guard structures of a semiconductor device 100 may comprise a guard structure 130" substantially comprising a shape of a plurality of non-continuous bars, in accordance with some embodiments.

FIG. 6 illustrates some embodiments of the present disclosure wherein a guard structure 130 is disposed around a group of the plurality of through-vias 110, as shown along the left side of the semiconductor device 100. The guard structure 130 substantially comprises a shape of a rectangle in the top view. A portion of the guard structure 130 is disposed between the through-vias 110 and the array region 112, and a portion of the guard structure 130 is disposed between the through-vias 110 and the periphery region 116. All or some of the guard structures of a semiconductor device 100 may comprise a guard structure 130 substantially comprising a rectangular shape that is disposed around a group of the through-vias 110, in accordance with some embodiments.

FIG. 6 also illustrates some embodiments of the present disclosure wherein a guard structure 130 is disposed around one of the plurality of through-vias 110', as shown at the top side of the semiconductor device 100. The guard structure 130 substantially comprises a shape of a square in the top view. A portion of the guard structure 130 is disposed between the through-vias 110 and the array region 112, and a portion of the guard structure 130 is disposed between the through-vias 110 and the periphery region 116. All or some of the guard structures 130 of a semiconductor device 100 may comprise a guard structure 130 having a substantially square shape that is disposed around one or all of the through-vias 110, in accordance with some embodiments.

FIG. 7 illustrates some embodiments of the present disclosure wherein a guard structure 130 is disposed around a group of the plurality of periphery devices 126, as shown along the left side of the semiconductor device 100. The guard structure 130 substantially comprises a shape of a rectangle in the top view. A portion of the guard structure 130 is disposed between the through-vias 110 and the array region 112, and a portion of the guard structure 130 is disposed between the through-vias 110 and the periphery devices 126 in the periphery region 116. All or some of the guard structures of a semiconductor device 100 may comprise a guard structure 130 having a substantially rectangular shape that is disposed around a group of the periphery devices 126, in accordance with some embodiments.

FIG. 7 also illustrates some embodiments of the present disclosure wherein a guard structure 130 is disposed around one of the periphery devices 126', as shown along the top side of the semiconductor device 100. The guard structure 130 substantially comprises a shape of a square in the top view. A portion of the guard structure 130 is disposed between the through-vias 110 and the array region 112, and a portion of the guard structure 130 is disposed between the through-vias 110 and the periphery device 126 in the periphery region 116. All or some of the guard structures 130 of a semiconductor device 100 may comprise a guard structure 130 having a substantially square shape that is disposed around one or all of the periphery devices 126, in accordance with some embodiments.

In the embodiments shown in FIG. 6, the guard structures 130 may alternatively comprise a continuous bar, a plurality of continuous bars, a non-continuous bar, a plurality of non-continuous bars, and/or combinations thereof (i.e., as shown in FIG. 5), disposed proximate or around a group of the through-vias 110 or one of the through-vias 110'. Likewise, In the embodiments shown in FIG. 7, the guard structures 130 may alternatively comprise a continuous bar, a plurality of continuous bars, a non-continuous bar, a plurality of non-continuous bars, and/or combinations thereof (i.e., as shown in FIG. 5), disposed proximate or around a group of the periphery devices 126 or one of the periphery devices 126'.

Furthermore, a guard structure of a semiconductor device 100 may comprise one or more of the novel guard structures 130, 130', and 130" positioned in the locations described on the semiconductor device 100 herein in accordance with some embodiments, for example.

Referring again to FIG. 4, some examples of combinations of the metal features 130a, P-type regions 130b, and N-type regions 130c that may be used to form the guard structures 130, 130', and 130" described herein may comprise: a first P-type region 130b, an N-type 130c region adjacent the first P-type region 130b, and a second P-type region 130b adjacent the N-type region 130c; a first metal feature 130a, a first P-type region 130b proximate the first metal feature 130a, an N-type 130c region adjacent the first P-type region 130b, a second P-type region 130b adjacent the N-type region 130c, and a second metal feature 130a proximate the second P-type region 130b; or an N-type region 130c, P-type region 130b adjacent the N-type region 130c, and a metal feature 130a proximate the P-type region 130b, as examples. Alternatively, the metal features 130a, P-type regions 130b, and N-type regions 130c may be combined in other configurations to form the guard structures 130, 130', and 130" described herein.

Figure 8:
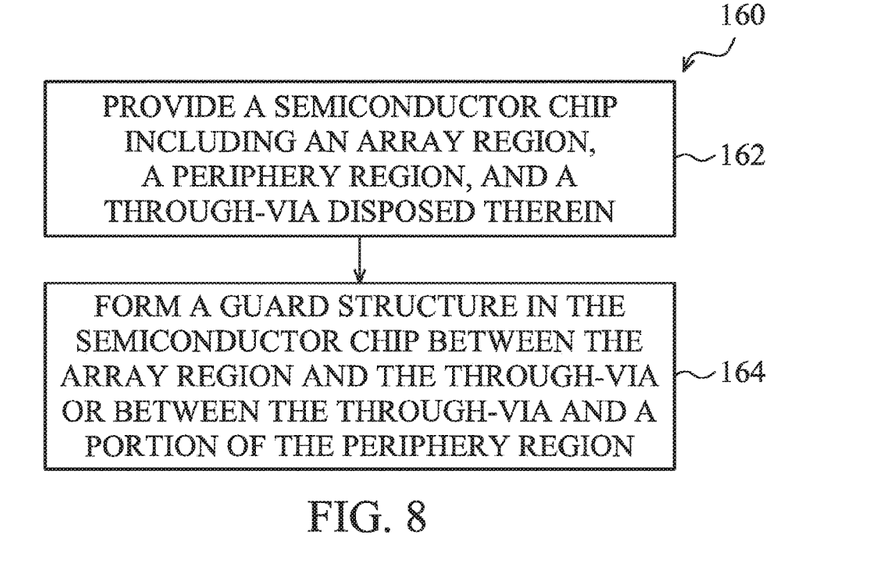
FIG. 8 is a flow chart showing a method of manufacturing a semiconductor device in accordance with some embodiments.

FIG. 8 is a flow chart 160 showing a method of manufacturing a semiconductor device 100 in accordance with some embodiments. In step 162, a semiconductor chip W1 is provided (see also FIG. 1) that includes an array region 112, a periphery region 116, and a through-via 110a disposed therein. In step 164, a guard structure 130 is formed in the semiconductor chip W1 between the array region 112 and the through via 110a or between the through-via 110a and a portion of the periphery region 116 (see FIG. 3).

Some embodiments of the present disclosure include manufacturing methods for semiconductor devices 100, and also include semiconductor devices 100 manufactured using the methods and that include the novel guard structures 130, 130', and 130" described herein. Some embodiments of the present disclosure also include image sensor devices that include the guard structures 130, 130', and 130" described herein.

In some embodiments, the image sensor devices comprise stacked complementary metal oxide semiconductor (CMOS) back side illumination (BSI) image sensor devices, for example. Referring again to FIG. 1, a top surface of the first semiconductor chip W1 comprises a back side of the semiconductor device 100, in some embodiments. The through-vias 110 extend from the back side surface through at least a portion of the first semiconductor chip W1 in these embodiments, for example. The guard structures 130 described herein extend from the back side surface fully through the substrate 102a of the first semiconductor chip W1, as shown in FIG. 4, in accordance with some embodiments.

Advantages of some embodiments of the disclosure include providing novel guard structures 130, 130' and 130" that improve performance of semiconductor devices and image sensor devices. The guard structures 130, 130', and 130" comprise continuous or non-continuous rings of conductive or semiconductive material that reduce or improve phenomena of dark current, white pixels, and noise that can occur in some image sensor applications and other semiconductor device applications, in some embodiments, for example. The guard structures 130, 130', and 130" reduce through-via 110 process charging build-up caused by grounding paths, noise, and tensor or compressive stress. A voltage may be applied to the guard structure 130, 130', and 130" to further reduce noise, in some applications. In other applications, a voltage may not be applied to the guard structures 130, 130', and 130". In embodiments wherein the guard structures 130, 130', and 130" include metal features 130a, RF noise is reduced in some embodiments, due to a shielding effect provided by the novel guard structures 130, 130', and 130", for example. Furthermore, the novel guard structures 130, 130', and 130" and designs are easily implementable in manufacturing process flows.

In accordance with some embodiments of the present disclosure, a semiconductor device includes a semiconductor chip including an array region, a periphery region, and a through-via disposed therein. The semiconductor device includes a guard structure disposed in the semiconductor chip between the array region and the through-via or between the through-via and a portion of the periphery region.

In accordance with other embodiments, a method of manufacturing a semiconductor device includes providing a semiconductor chip including an array region, a periphery region, and a through-via disposed therein, and forming a guard structure in the semiconductor chip between the array region and the through-via or between the through-via and a portion of the periphery region.

In accordance with other embodiments, an image sensor device includes a first semiconductor chip including an array region, a periphery region disposed around the array region, and a first through-via disposed between the array region and the periphery region. The image sensor device includes a second semiconductor chip bonded to the first semiconductor chip. The second semiconductor chip includes a second through-via disposed therein, the second through-via also being disposed in the first semiconductor chip. A guard structure is disposed in the first semiconductor chip between the array region and the first through-via or the second through-via, or between a portion of the periphery region and the first through-via or the second through-via.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    bonding a first semiconductor chip to a second semiconductor chip, the first semiconductor chip comprising an array region and a periphery region disposed around the array region;
    forming a first through-via extending through the first semiconductor chip and extending into the second semiconductor chip; and
    forming a first guard structure in the first semiconductor chip between the array region and the first through-via, the first guard structure comprising a conductive material, an n-type region, and a p-type region.

2. The method of claim 1 further comprising:
    forming a second guard structure between a portion of the periphery region and the first through-via.

3. The method of claim 2, wherein forming the second guard structure comprises:
    forming a trench in a first portion of the first semiconductor chip;
    filling the trench with a conductive material;
    implanting a second portion of the first semiconductor chip with an n-type impurity to form an n-type region;
    implanting a third portion of the first semiconductor chip with a p-type impurity to form a p-type region; and
    forming shallow trench isolation regions in the first semiconductor chip proximate the n-type region and the p-type region, the shallow trench isolation regions comprising an insulating material.

4. The method of claim 1, wherein forming the first guard structure comprises:
    forming a trench in a first portion of the first semiconductor chip;
    filling the trench with the conductive material;
    implanting a second portion of the first semiconductor chip with an n-type impurity to form the n-type region;

implanting a third portion of the first semiconductor chip with a p-type impurity to form the p-type region; and forming shallow trench isolation regions in the first semiconductor chip proximate the n-type region and the p-type region, the shallow trench isolation regions comprising an insulating material.

5. The method of claim 4, wherein filling the trench with the conductive material comprises filling the trench with a material selected from the group consisting essentially of: W, Cu, AlCu, and combinations thereof.

6. The method of claim 1, wherein the array region comprises an array of pixels.

7. The method of claim 1, wherein the first guard structure is formed at a depth of about 0.01 μm to about 100 μm below a surface of the first semiconductor chip.

8. The method of claim 1, wherein the first guard structure has a width of about 0.01 μm or greater.

9. The method of claim 1 further comprising:

applying a voltage to the first guard structure, wherein applying the voltage improves noise reduction of the first guard structure.

10. The method of claim 9, wherein applying the voltage to the first guard structure comprises applying a voltage in a range from about −10 Volts (V) to about 10 V.

11. A semiconductor device comprising:

a first semiconductor chip comprising an array region, a periphery region, and a first through-via extending through the first semiconductor chip;

a second semiconductor chip bonded to the first semiconductor chip, the first through-via extending into second semiconductor chip; and a first guard structure in the first semiconductor chip between the array region and the first through-via, wherein the first guard structure comprises an n-type region or a p-type region.

12. The semiconductor device of claim 11, wherein the first guard structure comprises a metal feature, the p-type region, the n-type region, a first insulating material on sidewalls of the metal feature, and a second insulating material adjacent the p-type region and the n-type region.

13. The semiconductor device of claim 11 further comprising:

a third semiconductor chip bonded to the second semiconductor chip, the first through-via extending into the third semiconductor chip.

14. The semiconductor device of claim 11 further comprising:

a second guard structure between a portion of the periphery region and the first through-via.

15. The semiconductor device of claim 11, wherein the periphery region is disposed around the array region.

16. The semiconductor device of claim 11, wherein the array region comprises an array of pixels.

17. The semiconductor device of claim 11 further comprising:

a second through-via in the first semiconductor chip, the second through-via not extending into the second semiconductor chip.

18. An image sensor device comprising:

a first semiconductor chip comprising an array region and a first through-via extending through the first semiconductor chip;

a second semiconductor chip bonded to the first semiconductor chip, the first through-via extending into second semiconductor chip; and a first guard structure in the first semiconductor chip outside the array region, the first guard structure comprising a metal feature, a p-type region, an n-type region, a first insulating material on sidewalls of the metal feature, and a second insulating material adjacent the p-type region and the n-type region.

19. The image sensor device of claim 18, wherein the first guard structure is between the array region and the first through-via.

20. The image sensor device of claim 18, wherein the first semiconductor chip further comprises a periphery region disposed around the array region, the first through-via being disposed between the array region and the periphery region, the first guard structure being between the first through-via and the periphery region.

* * * * *